United States Patent
Nakamori et al.

(10) Patent No.: US 7,773,400 B2
(45) Date of Patent: Aug. 10, 2010

(54) INVERTER DRIVING CIRCUIT AN INVERTER CONTROL CIRCUIT

(75) Inventors: Akira Nakamori, Nagano (JP); Kazunori Oyabe, Nagano (JP); Manabu Watanabe, Nagano (JP)

(73) Assignee: Fuji Electric Systems Co., Ltd. (JP)

( * ) Notice: Subject to any disclaimer, the term of this patent is extended or adjusted under 35 U.S.C. 154(b) by 182 days.

(21) Appl. No.: 11/845,237

(22) Filed: Aug. 27, 2007

(65) Prior Publication Data

US 2008/0094121 A1    Apr. 24, 2008

(30) Foreign Application Priority Data

Oct. 18, 2006    (JP)    ............................. 2006-283739

(51) Int. Cl.
*H02M 7/5387* (2007.01)
(52) U.S. Cl. .......................... 363/132; 363/41; 323/283
(58) Field of Classification Search .................. 327/172, 327/262, 264, 276–278, 281, 288; 363/17, 363/20, 95, 98, 132, 41; 323/222, 225, 207, 323/209, 211, 283
See application file for complete search history.

(56) References Cited

U.S. PATENT DOCUMENTS 6,191,630 B1 *   2/2001   Ozawa et al. ................ 327/278
6,324,085 B2 *  11/2001   Kimura et al. .............. 363/132

FOREIGN PATENT DOCUMENTS

JP    2003-051740 A    2/2003

* cited by examiner

*Primary Examiner*—Rajnikant B Patel
(74) *Attorney, Agent, or Firm*—Rossi, Kimms & McDowell LLP

(57) ABSTRACT

A phase adjusting circuit is provided that is capable of adjusting a delay time at a rise or fall of a driving signal for driving an inverter. A phase adjusting circuit is provided upstream of a driver circuit, and an output from a hysteresis comparator is input to the driver circuit through the phase adjusting circuit. The phase adjusting circuit delays at least either rise or fall of the signal input to the driver circuit to adjust any difference between the pulse width of the input signal input to the driver circuit and the pulse width of a signal output from a switching element of an inverter driven by the driver circuit.

8 Claims, 10 Drawing Sheets

INVERTER DRIVING CIRCUIT AN INVERTER CONTROL CIRCUIT

CROSS-REFERENCE TO RELATED APPLICATION

This application claims priority from Japanese Patent Application 2006-283739 filed on Oct. 18, 2006, the contents of which are incorporated herein by reference.

BACKGROUND

The present invention relates to an inverter driving circuit and an inverter control circuit and, more particularly, the invention is preferably applied to a method of adjusting the phase of a drive signal for driving an inverter which converts a direct current into an alternating current.

Motor control methods include a method of driving a motor while converting an alternating-current voltage output from a AC power supply with a converter into a direct current and converting the direct current converted by the converter into an alternating-current voltage with an inverter. For the purpose of power saving, the inverter may be driven using a method in which switching elements constituting the inverter are PWM-controlled.

FIG. 13 is a block diagram showing a schematic configuration of a driving circuit for driving an inverter according to the related art. Referring to FIG. 13, a driving circuit 132 includes an input circuit 52, a noise-malfunction prevention circuit 53, and a driver circuit 55. The input circuit 52 includes a resistor R1 connected between a power supply terminal 91 and an input terminal 92. The noise-malfunction prevention circuit 53 includes a hysteresis comparator 56. One input of the hysteresis comparator 56 is connected to the input terminal 92, and the other input of the hysteresis comparator 56 is connected to a ground terminal 94 through a reference voltage source 57. An output of the hysteresis comparator 56 is connected to the driver circuit 55.

The driver circuit 55 includes a P-channel field effect transistor M1 and an N-channel field effect transistor M2. The source of the P-channel field effect transistor M1 is connected to the power supply terminal 91. The drain of the P-channel field effect transistor M1 is connected to the drain of the N-channel field effect transistor M2 and an output terminal 93. The source of the N-channel field effect transistor M2 is connected to a ground terminal 95, and the gates of the P-channel field effect transistor M1 and the N-channel field effect transistor M2 are connected in common.

The inverter includes switching elements S1 and S4 which are series-connected to each other, and the output terminal 93 is connected to the gate of the switching element S4. For example, IGBTs (Insulated Gate Bipolar Transistors) may be used as the switching elements S1 and S4.

FIG. 14 is a timing chart showing operations of the driving circuit shown in FIG. 13. Referring to FIG. 14, when an input signal 51 is input between the input terminal 92 and the ground terminal 94, the signal is input to the hysteresis comparator 56 through the input terminal 52. Two voltage thresholds or higher and lower voltage thresholds (e.g., 1.36 V and 2.00 V) are set in the noise-malfunction prevention circuit 53 by the reference voltage source 57.

When the input signal 51 is input to the hysteresis comparator 56, the hysteresis comparator 56 compares the input voltage (a'-point voltage) with the lower voltage threshold in the case that the a'-point voltage is in transition from a power supply voltage to a ground voltage and compares the a'-point voltage with the higher voltage threshold in the case that the a'-point voltage is in transition from the ground voltage to the power supply voltage. When the a'-point voltage exceeds the voltage threshold, the output of the hysteresis comparator 56 changes to a high level which results in a b'-point voltage in the form of a rectangular wave. Since the a'-point voltage is compared with the two thresholds or high and low voltage thresholds, it is possible to avoid malfunctions attributable to noises having an amplitude equal to or smaller than the higher voltage threshold minus the lower voltage threshold.

The output from the hysteresis comparator 56 is input to the driver circuit 55, and the b'-point voltage is subjected to current amplification in the driver circuit 55. The signal obtained through the current amplification in the driver circuit 55 is input to the gate of the switching element S4 through the output terminal 93 to charge or discharge a gate capacity of the switching element 4, whereby the switching of the switching element S4 is controlled Referring now to a gate voltage (c-point voltage) of the switching element 4, the c'-point voltage starts rising with a delay of a delay time Td1 after the b'-point voltage starts rising, and the c'-point voltage starts falling with a delay of a delay time Td2 after the b'-point voltage starts falling. The delay time Td1 is a delay which occurs in the driver circuit 55 itself when the c'-point voltage rises, and the delay time Td2 is a delay which occurs in the driver circuit 55 itself when the c'-point voltage falls.

When the c'-point voltage is applied to the gate of the switching element S4, since the switching element S4 has a parasitic capacity, there is also a delay between a collector-emitter voltage Vce and a collector current Ic of the switching element S4. When the load of the driver circuit 55 is the switching element S4 (P1), a delay time between a point when the c'-point voltage starts rising and a point when the voltage completely rises is longer than that in the case in which the load of the switching element S4 is simply constituted by a capacitor (P2). Let us assume that Td3 represents a delay time between a point when the c'-point voltage starts rising and a point when the collector current Ic reaches 90% of the value that the current assumes when it completely rises.

When the load of the driver circuit 55 is the switching element S4 (P1), a delay time between a point when the c'-point voltage starts falling and a point when the voltage completely falls is greater than that in the case wherein the load of the driver circuit 55 is simply constituted by a capacitor (P2). Let us assume that Td4 represents a delay time between a point when the c'-point voltage starts falling and a point when the collector current Ic reaches 10% of the value that the current assumes when it completely rises. As a result, the circuit as a whole including the driving circuit 132 and the switching element S4 has a rising delay time Ton which is Td1 plus Td3 and a falling delay time Toff which is Td2 plus Td4.

An index Tdead indicating input/output phase characteristics of the entire circuit including the driving circuit 132 and the switching element S4 can be defined as Tdead=Toff−Ton. Depending on the way that the driving circuit 132 and the switching element S4 are combined, there may be a great phase difference between input and output, and the index Tdead may have a great value.

For example, JP-2003-51740 discloses a semiconductor integrated circuit which is added with a terminal to allow a dead time to be set using an external resistor such that the dead time can be kept unchanged even in the case of a signal having a small pulse width. However, when the index Tdead indicating the input/output phase characteristics of the entire circuit including the driving circuit 132 and the switching element S4 has a great value, there is a great difference between the pulse width of the a'-point voltage and the pulse width of the c'-point voltage. Since the controllability of pulse widths is consequently reduced in exercising PWM control, a problem has arisen in that the control performance of the PWM control system is degraded.

In view of the above, it would be desirable to provide an inverter driving circuit and an inverter control circuit capable of adjusting a delay time when a drive signal for driving an inverter rises or falls.

SUMMARY OF THE INVENTION

In order to solve the above-described problem, the invention provides an inverter driving circuit including an input circuit for inputting an input signal in the form of a rectangular wave, a driver circuit for driving an inverter based on the input signal input through the input circuit, and a phase adjusting circuit which is provided upstream of the driver circuit and which delays at least either rise or fall of the input signal to adjust any difference between a pulse width of the input signal input to the driver circuit and a pulse width of a signal output from a switching element of the inverter driven by the driver circuit.

The invention further provides an inverter driving circuit, wherein the phase adjusting circuit adjusts the delay time of at least either rise or fall of the input signal such that a delay time between a point when the input of the input signal to the driver circuit is started and a point when the switching element is turned on equals a delay time between a point when the input of the input signal to the driver circuit is stopped and a point when the switching element is turned off.

The invention further provides an inverter driving circuit, wherein the phase adjusting circuit includes a constant current source for generating a constant current, a capacitor for charging the current generated by the constant current source, a reference voltage source for generating a reference voltage, a switching element for supplying the current generated by the constant current source to the capacitor based on the input signal, and a comparator for comparing the reference voltage generated by the reference voltage source and a voltage generated by the capacitor and in that the delay time of at least either rise or fall of the input signal is set based on the result of the comparison made by the comparator.

The invention still further provides an inverter driving circuit, wherein at least one of the constant current source, the capacitor, and the reference voltage source is constituted by a plurality of such elements having different current values, capacities or reference voltages and in that any of the constant current sources, capacitors or reference voltage sources is selected from the plurality of constant current sources, capacitors or reference voltage sources to adjust at least either rise or fall of the input signal.

The invention still further provides an inverter driving circuit, wherein at least one of the constant current source, the capacitor, and the reference voltage source is incorporated through an external terminal of the driving circuit.

The invention also further provides an inverter control circuit, including a PWM control unit for exercising PWM control over an inverter and a phase adjusting circuit which is provided upstream of a driving circuit for driving the inverter and which delays at least either rise or fall of a control signal output from the PWM control unit to adjust a difference between a pulse width of an input signal input to the driving circuit and a pulse width of a signal output from a switching element of the inverter controlled by the driving circuit.

The invention also provides an inverter control circuit, wherein the phase adjusting circuit adjusts the delay time of at least either rise or fall of the control signal such that a delay time between a point when the input of the input signal to the driver circuit is started and a point when the switching element is turned on equals a delay time between a point when the input of the input signal to the driver circuit is stopped and a point when the switching element is turned off.

The invention still further provides an inverter control circuit, wherein the phase adjusting circuit includes a constant current source for generating a constant current, a capacitor for charging the current generated by the constant current source, a reference voltage source for generating a reference voltage, a switching element for supplying the current generated by the constant current source to the capacitor based on the input signal, and a comparator for comparing the reference voltage generated by the reference voltage source and a voltage generated by the capacitor and in that the a delay time of at least either rise or fall of the control signal is set based on the result of the comparison made by the comparator.

The invention still further provides an inverter control circuit, wherein at least one of the constant current source, the capacitor, and the reference voltage source is constituted by a plurality of such elements having different current values, capacities or reference voltages and in that any of the constant current sources, capacitors or reference voltage sources is selected from the plurality of constant current sources, capacitors or reference voltage sources to adjust at least either rise or fall of the control signal.

Finally, the invention also provides an inverter control circuit, wherein at least one of the constant current source, the capacitor, and the reference voltage source is incorporated through an external terminal of the control circuit.

As described above, according to the invention, a delay time of a rise or fall of a drive signal for driving an inverter can be adjusted. In the circuit as a whole including the driving circuit and the switching element, a delay time between a point when an input to the driver circuit is started and a point when the driving of the inverter is started can be made equal to a delay time between a point when the input to the driver circuit is stopped and a point when the driving of the inverter is stopped. As a result, the pulse width of a signal input to the driver circuit can be made equal to the pulse width of a signal output from the driver circuit. Since controllability of a pulse width can be improved as thus described in exercising PWM control, the control performance of a PWM control system can be improved.

BRIEF DESCRIPTION OF THE DRAWINGS

The invention will be described with reference to certain preferred embodiments thereof along with the accompanying drawings, wherein.

DESCRIPTION OF THE PREFERRED EMBODIMENTS OF THE INVENTION

An inverter driving circuit and an inverter control circuit according to embodiments of the invention will now be described with reference to the drawings.

Figure 1:
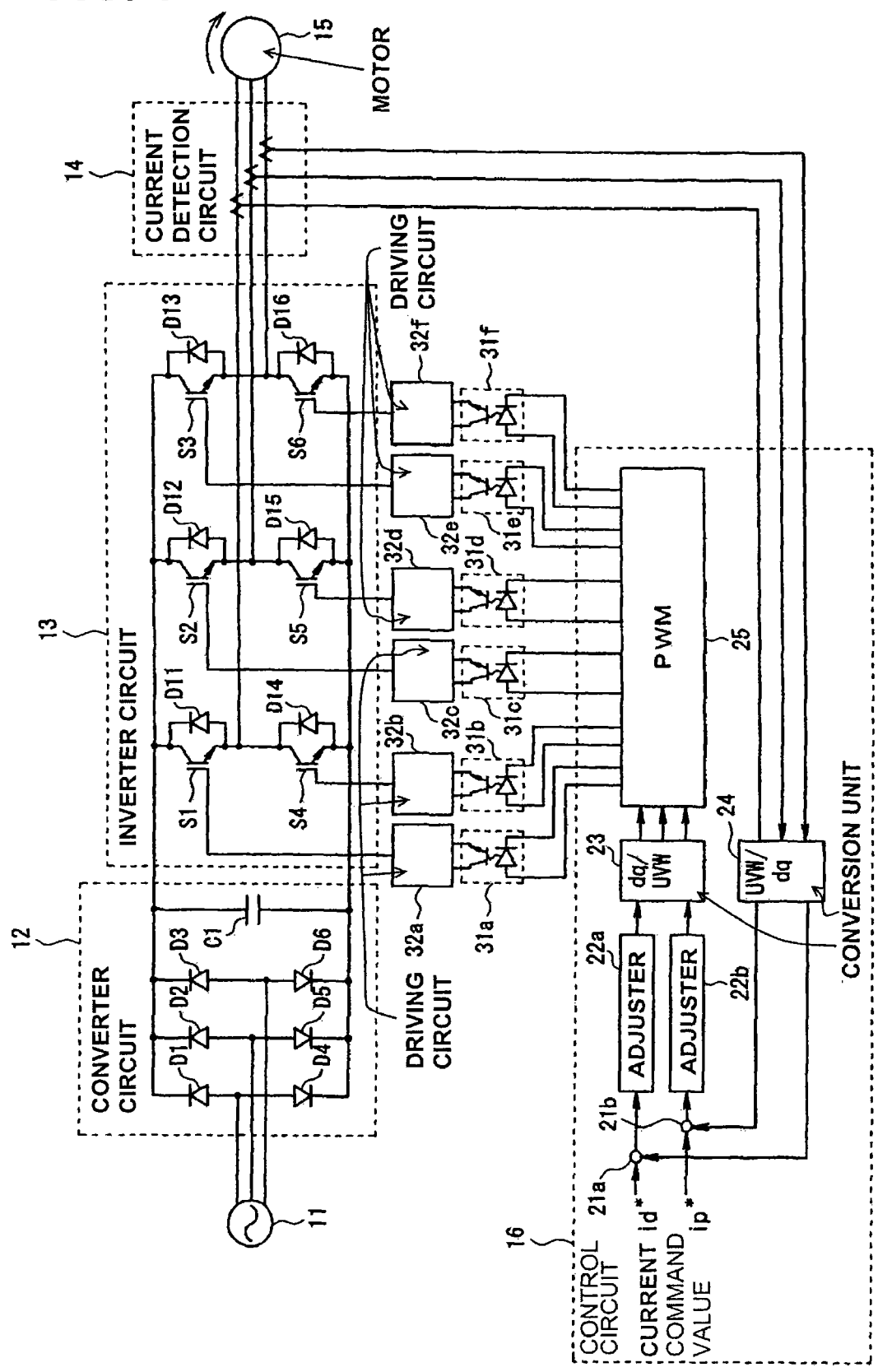
FIG. 1 is a block diagram showing a schematic configuration of a motor control system according to a first embodiment of the invention.

FIG. 1 is a block diagram showing a schematic configuration of a motor control system according to a first embodiment of the invention. Referring to FIG. 1, an AC power supply 11 is connected to an AC motor 15 through a converter 12 and an inverter 13. The converter 12 includes rectifier diodes D1 to D6 for rectifying a three-phase current and a smoothing capacitor C1. The inverter 13 includes switching elements S1 to S6 which are switched based on a gate pulse and feedback diodes D11 to D16 which are inverse-parallel connected to the switching elements S1 to S6, respectively. A current sensor 14 is provided on the output side of the inverter 13 to detect three-phase alternating currents Iu, Iv, and Iw output by the inverter 13. For example, IGBTs may be used as the switching elements S1 to S6.

The motor control system includes a control circuit 16 for exercising feedback control of the AC motor 15, driving circuits 32a to 32f for driving the inverter 13 by outputting gate pulses to the switching elements S1 to S6, respectively, and photo-couplers 31a to 31f for insulated transmission of control signals output by the control circuit 16 to the driving circuits 32a to 32f, respectively.

The control circuit 16 includes a comparison unit 21a for comparing a d-axis (magnetic flux component) current command value id* and a d-axis current measured value id and outputting a signal representing a deviation between them, a comparison unit 21b for comparing a q-axis (torque component) current command value iq* and a q-axis current measured value iq and outputting a signal representing a deviation between them, an adjuster 22a for exercising proportional-plus-integral control of the deviation signal output by the comparison unit 21a, an adjuster 22b for exercising proportional-plus-integral control of the deviation signal output by the comparison unit 21b, a PWM control unit 25 for exercising PWM control of the inverter 13, a dq/UVW conversion unit 23 for performing coordinate transformation to convert d- and q-components into UVW components, and a UVW/dq conversion unit 24 for performing coordinate transformation to convert UVW components into d- and q-components.

A three-phase alternating-current voltage generated by the AC power supply 11 is rectified by the converter 12 to supply a direct-current voltage to the inverter 13. The direct-current voltage output by the converter 12 is converted by the inverter 13 into a three-phase alternating-current voltage which is then supplied to the AC motor 15 to drive the AC motor 15.

The AC motor 15 is driven by inputting a d-axis current command value id* to the comparator 21a and a q-axis (torque component) current command value iq* to the comparator 21b. A u-phase current Iu, a v-phase current Iv, and a w-phase current Iw output from the inverter 13 are detected by the current sensor 14 and input to the UVW/dq conversion unit 24. Measured values of the u-phase current Iu, the v-phase current Iv, and the w-phase current Iw are converted by the UVW/dq conversion unit 24 into a d-axis current measured value id and a q-axis current measured value iq which are then input to the comparison units 21a and 21b, respectively.

When the d-axis current command value id* and the d-axis current measured value id are input to the comparison unit 21a, a signal representing a deviation between them is calculated by the comparison unit 21a. The signal is thereafter subjected to proportional-plus-integral control by the adjuster 22a and output to the dq/UVW conversion unit 23. When the q-axis current command value iq* and the q-axis current measured value iq are input to the comparison unit 21b, a signal representing a deviation between them is calculated by the comparison unit 21b. The signal is thereafter subjected to proportional-plus-integral control by the adjuster 22b and output to the dq/UVW conversion unit 23.

The d- and q-components output by the adjusters 22a and 22b, respectively, are converted by the dq/UVW conversion unit 23 into a u-phase voltage, a v-phase voltage, and a w-phase voltage which are then output to the PWM control unit 25. Thus, the PWM control unit 25 generates a gate pulse for controlling each of the switching elements S1 to S6 on or off. The gate pulses generated by the PWM control unit 25 are transmitted to the driving circuits 32a to 32f through the photo-couplers 31a to 31f, respectively, and the driving circuits 32a to 32f drive the inverter 13 to operate the AC motor 15 under PWM control.

Figure 2:
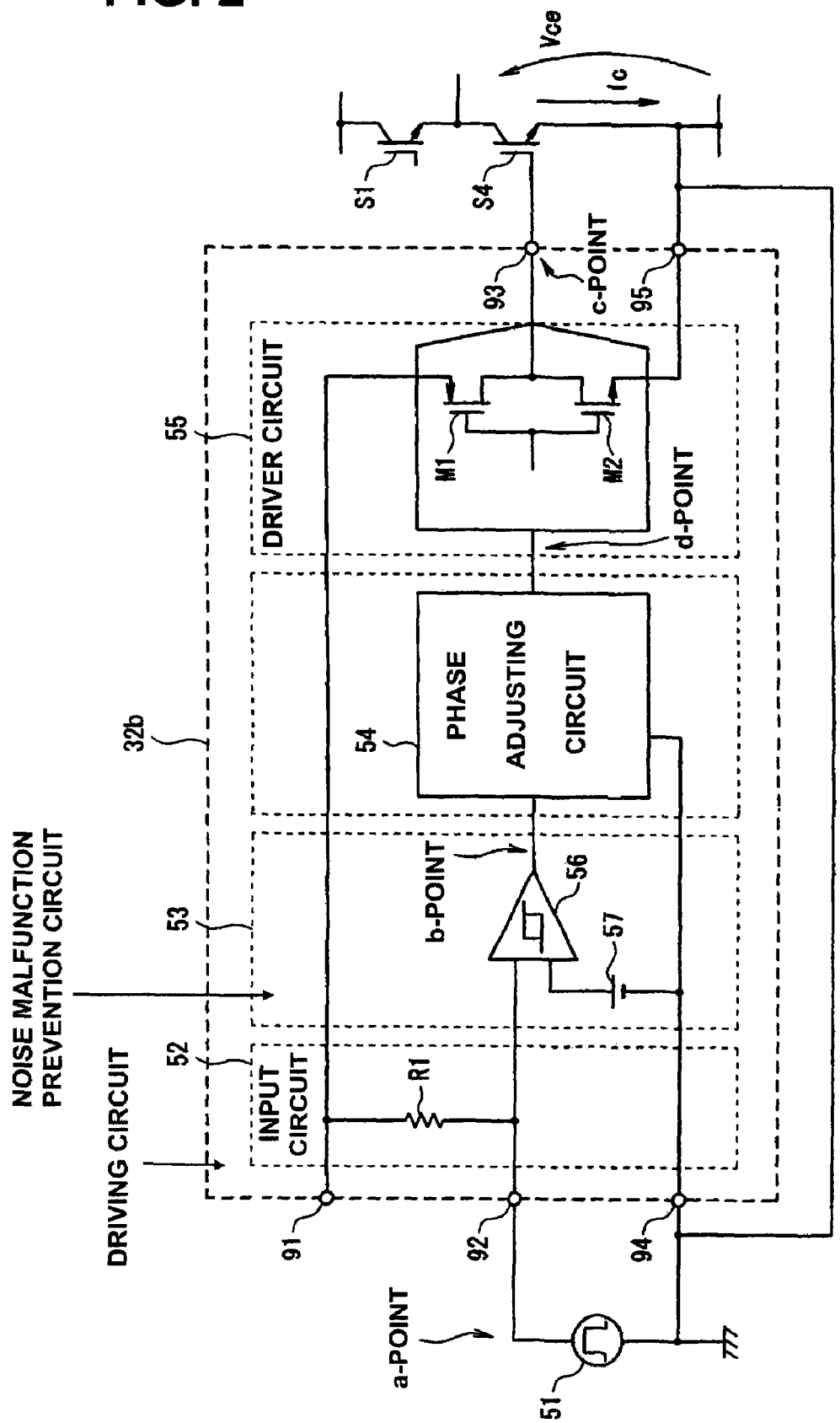
FIG. 2 is a block diagram showing a schematic configuration of a driving circuit shown in FIG. 1.

FIG. 2 is a block diagram showing a schematic configuration of the driving circuits shown in FIG. 1. Referring to FIG. 2, for example, the driving circuit 32b includes a phase adjusting circuit 54 provided upstream of a driver circuit 55 in addition to the configuration shown in FIG. 13. The output of a hysteresis comparator 56 is input to the driver circuit 55 through the phase adjusting circuit 54. The phase adjusting circuit 54 can delay at least either rise or fall of the signal input to the driver circuit 55 to adjust any difference between the pulse width of the input signal input to the driver circuit 55 and the pulse width of a signal output by the switching element S4 of the inverter 13 driven by the driver circuit 55.

For example, the phase adjusting circuit 54 can adjust a delay time of at least either rise or fall of the signal input to the driver circuit 55 such that a delay time between a point when the input to the driver circuit 55 is started and a point when the switching element S4 is turned on equals a delay time between a point when the input to the driver circuit 55 is stopped and a point when the switching element S4 is turned off. That is, the phase adjusting circuit 54 can adjust a delay time of at least either rise or fall of the signal input to the driver circuit 55 such that Tdead=Toff−Ton=0 will be true in the circuit as a whole including the driving circuit 32b and the switching element S4.

For example, the on state of the switching element S4 can be defined as a state in which the collector current Ic has reached 90% of the value it assumes when it completely rises. For example, the off state of the switching element S4 can be defined as a state in which the collector current Ic has decreased to 10% of the value it assumes when it completely rises. While the embodiment shown in FIG. 2 has been described with reference to the driving circuit 32b as an example, the same configuration may be employed also for the driving circuits 32a and 32c to 32f shown in FIG. 1.

Figure 3:
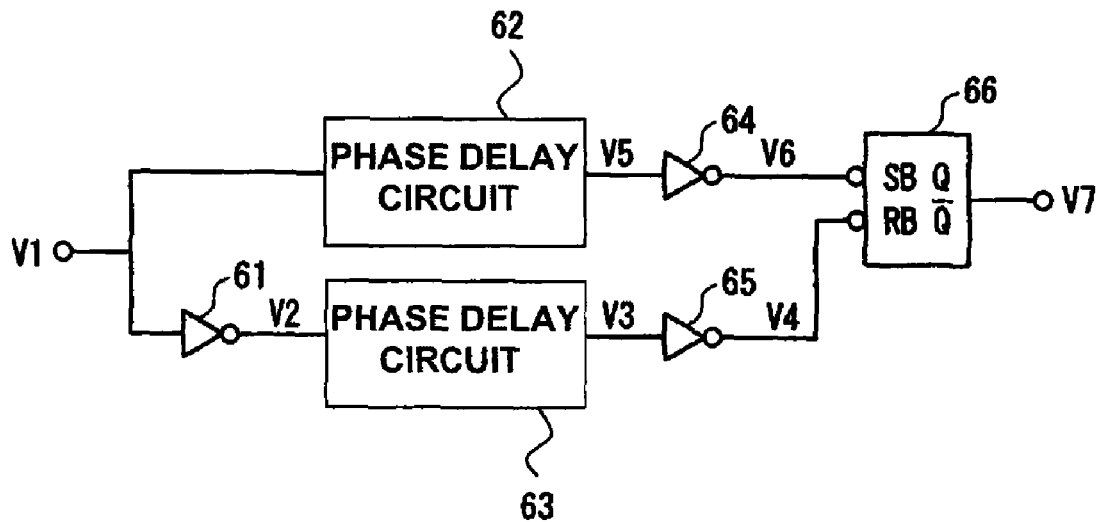
FIG. 3 is a block diagram showing a schematic configuration of a phase adjusting circuit shown in FIG. 2.

FIG. 3 is a block diagram showing a schematic configuration of the phase adjusting circuit in FIG. 2. Referring to FIG. 3, the phase adjusting circuit 54 includes inversion circuits 61, 64, and 65, phase delay circuits 62 and 63, and an RS flip-flop 66. The phase delay circuit 62 can adjust a delay time Ton at a rise time of the entire circuit including the driving circuit 32b and the switching element S4. The phase delay circuit 63 can adjust a delay time Toff at a fall time of the entire circuit including the driving circuit 32b and the switching element S4.

Figure 4:
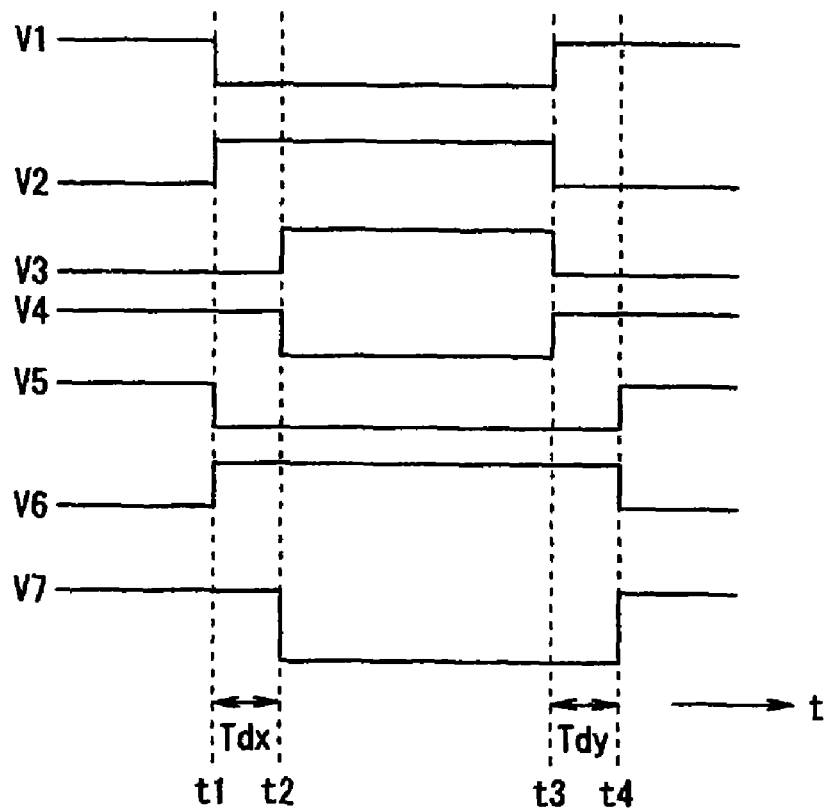
FIG. 4 is a timing chart showing operations of a phase adjusting circuit shown in FIG. 3.

FIG. 4 is a timing chart showing operations of the phase adjusting circuit shown in FIG. 3. At a time t1 in FIG. 4, an input voltage V1 to the phase adjusting circuit 54 is input to the phase delay circuit 62, and the voltage changes from a high level to a low level. The input voltage V1 to the phase adjusting circuit 54 is also input to the inversion circuit 61, and the input voltage V1 is inverted by the inversion circuit 61 and is then input to the phase delay circuit 63.

At a time t2, a rising edge of a resultant voltage V2 input to the phase delay circuit 63 is delayed by a delay time Tdx in the phase delay circuit 63, and the voltage is thereafter input to the inversion circuit 65. A resultant voltage V3 output from the phase delay circuit 63 is inverted by the inversion circuit 65 and is thereafter input to a reset terminal of the RS flip-flop 66. When a resultant voltage V4 output by the inversion circuit 65 is input to the reset terminal of the RS flip-flop 66, an output Q of the RS flip-flop 66 changes from the high level to the low level, and the output Q of the RS flip-flop 66 falls with a delay of the delay time Tdx after the fall of the input voltage V1.

When the input voltage V1 input to the phase delay circuit 62 changes from the low level to the high level at a time t3, a rising edge of the voltage V1 input to the phase delay circuit 62 is input to the inversion circuit 64 after being delayed by a delay time Tdy in the phase delay circuit 62. A resultant voltage V5 output by the phase delay circuit 62 is inverted by the inversion circuit 64 and is thereafter input to a set terminal of the RS flip-flop 66. When a resultant voltage V6 output by the inversion circuit 64 is input to the set terminal of the RS flip-flop 66, the output Q of the RS flop-flop 66 changes from the low level to the high level, and the output Q of the RS flip-flop 66 rises with a delay of the delay time Tdy after the rise of the input voltage V1.

Figure 5:
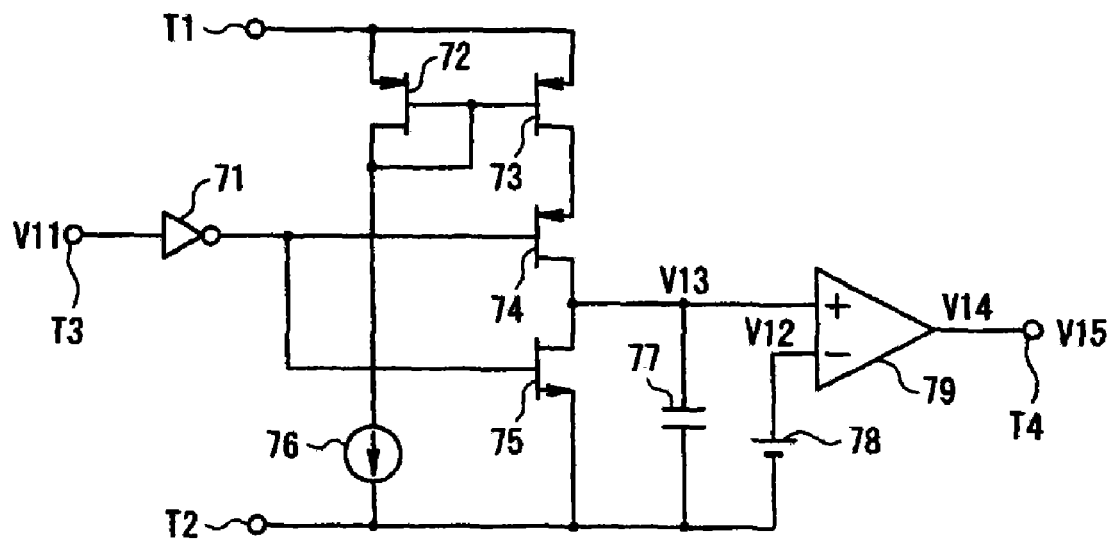
FIG. 5 is a diagram showing a circuit configuration of the phase delay circuit shown in FIG. 3.

FIG. 5 is a diagram showing a circuit configuration of the phase delay circuit shown in FIG. 3. Referring to FIG. 5, the sources of P-channel field effect transistors 72 and 73 are connected to a power supply terminal T1. The drain and gate of the P-channel field effect transistor 72 are connected to a ground terminal T2 through a constant current source 76. The drain of the P-channel field effect transistor 73 is connected to the source of a P-channel field effect transistor 74. The drain of the P-channel field effect transistor 74 is connected to the drain of an N-channel field effect transistor 75. The source of the N-channel field effect transistor 75 is connected to the ground terminal T2.

An input terminal T3 is connected to the gates of the P-channel field effect transistor 74 and the N-channel field effect transistor 75 though an inversion circuit 71. A non-inverting input terminal of a comparator 79 is connected to the ground terminal T2 through a capacitor 77 and also connected to the drain of the N-channel field effect transistor 75. An inverting input terminal of the comparator 79 is connected to a reference voltage source 78, and an output of the comparator 79 is connected to an output terminal T4.

Figure 6:
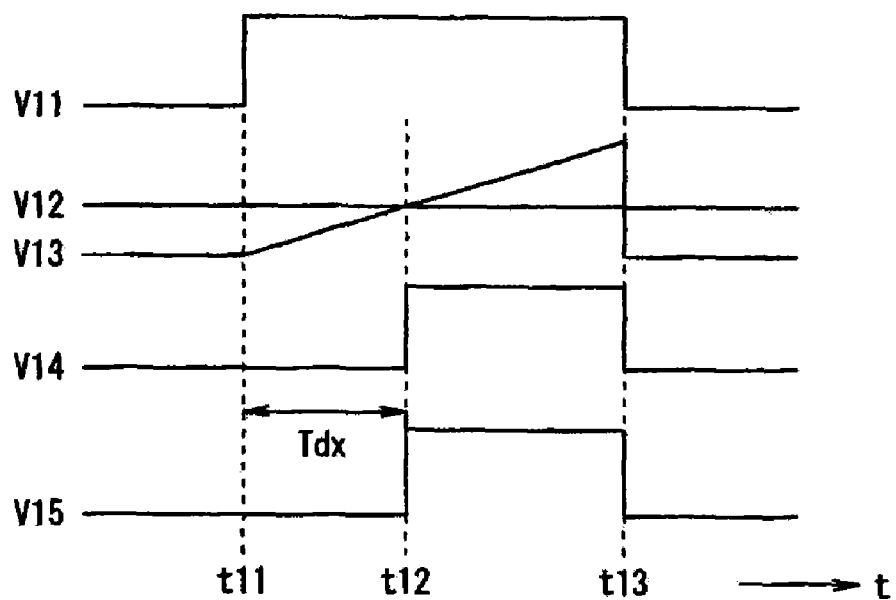
FIG. 6 is a timing chart showing operations of the phase delay circuit shown in FIG. 5.

FIG. 6 is a timing chart showing operations of the phase delay circuit shown in FIG. 5. At a time t11 shown in FIG. 6, an input voltage V11 is input to the phase delay circuit 62 shown in FIG. 3 through the input terminal T3, and the input voltage V11 changes from the low level to the high level. Then, the input voltage V11 is inverted by the inversion circuit 71, and the gates of the P-channel field effect transistor 74 and the N-channel field effect transistor 75 change to the low level.

When the gates of the P-channel field effect transistor 74 and the N-channel field effect transistor 75 change to the low level, the P-channel field effect transistor 74 is turned on, and the N-channel field effect transistor 75 is turned off. When the P-channel field effect transistor 74 is turned on, a current having the same value as the current flowing through the P-channel field effect transistor 72 flows to the P-channel field effect transistor 73 through the constant current source 76 as a result of a current mirror operation. Thus, the capacitor 77 is charged with the current flowing through the P-channel field effect transistor 73.

A resultant voltage V13 generated at the capacitor 77 is compared with a reference voltage V12 generated by the reference voltage source 78 at the comparator 79. When the voltage V13 generated at the capacitor 77 agrees with the reference voltage V12 generated by the reference voltage source 78 at a time t12, a resultant output voltage V14 from the comparator 79 changes from the low level to the high level, and an output voltage V15 from the output terminal T4 changes to the high level. As a result, the output voltage V15 from the output terminal T4 can be caused to rise with a delay of the delay time Tdx after the rise of the input voltage V11. A rise of the input voltage V11 can therefore be delayed by the delay time Tdx.

When the input voltage V11 changes from the high level to the low level at a time t13, the input voltage V11 is inverted by the inversion circuit 71, and the gates of the P-channel field effect transistor 74 and the N-channel field effect transistor 75 change to the high level. When the gates of the P-channel field effect transistor 74 and the N-channel field effect transistor 75 change to the high level, the P-channel field effect transistor 74 is turned off, and the N-channel field effect transistor 75 is turned on.

When the N-channel field effect transistor 75 is turned on, the charge which has been loaded on the capacitor 78 is discharged through the N-channel field effect transistor 75, and the voltage V13 generated at the capacitor 77 falls below the reference voltage V12 generated by the reference voltage source 78. As a result, the output voltage V14 from the comparator 79 changes from the high level to the low level, and the output voltage V15 from the output terminal T4 changes to the low level.

Figure 7:
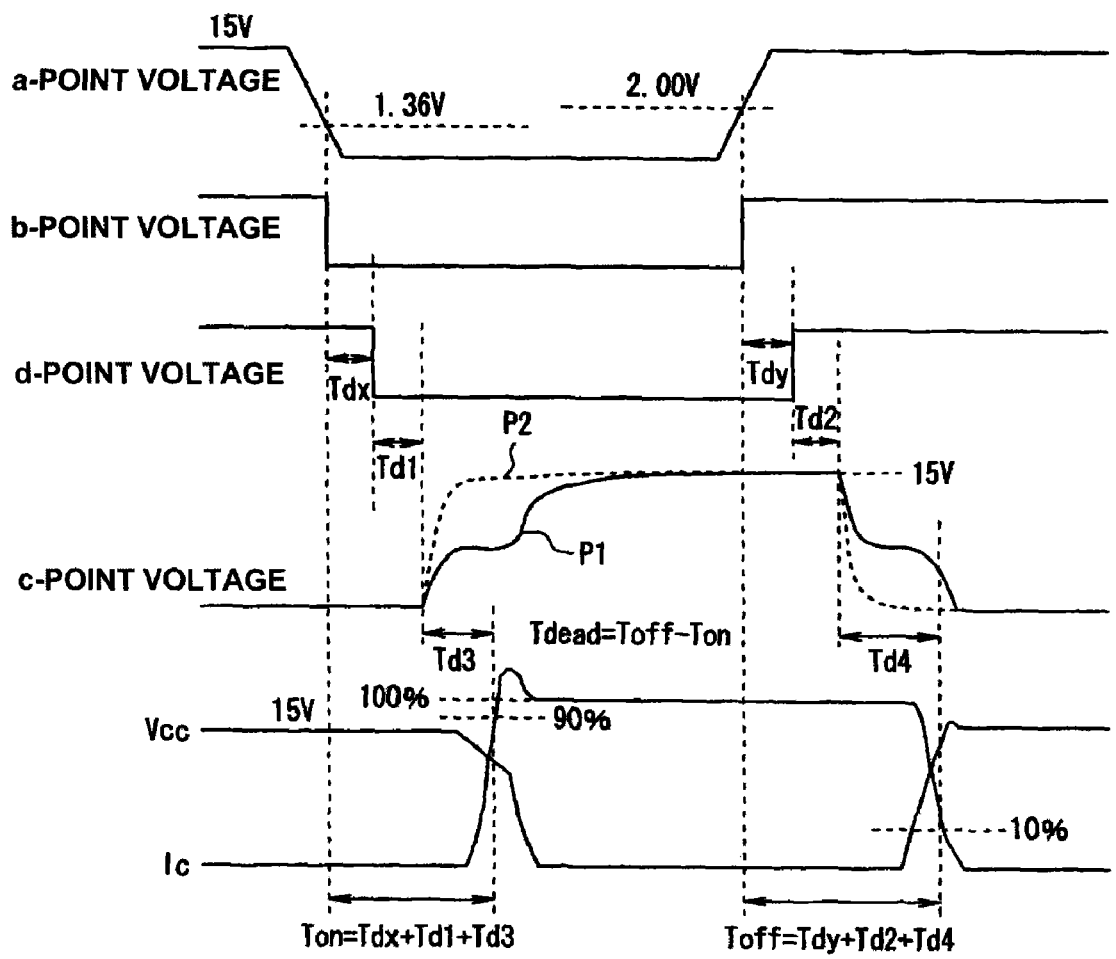
FIG. 7 is a timing chart showing operations of the driving circuit in FIG. 2.

FIG. 7 is a timing chart showing operations of the driving circuit in FIG. 2. Referring to FIG. 7, when the input signal 51 is input between the input terminal 92 and the ground terminal 94, the signal is input to the hysteresis comparator 56. When the input signal 51 is input to the hysteresis comparator 56, the hysteresis comparator 56 compares the a-point voltage with the lower voltage threshold in the case that the input voltage (a-point voltage) is in transition from the power supply voltage to the ground voltage. When the a-point voltage is equal to or lower than the voltage threshold, the output (b-point voltage) of the hysteresis comparator 56 changes to the low level.

The output (b-point voltage) from the hysteresis comparator 56 is input to the phase adjusting circuit 54, and the fall of the b-point voltage is input to the driver circuit 55 after being delayed by the delay time Tdx in the phase adjusting circuit 54. When a resultant output (d-point voltage) from the phase adjusting circuit 54 is input to the driver circuit 55, the d-point voltage is current-amplified by the driver circuit 55. The signal obtained through the current-amplification at the driver circuit 55 is input to the gate of the switching element S4 through the output terminal 93. The gate capacity of the switching element S4 is thus charged to turn the switching element S4 on, and the collector current Ic flows through the switching element S4.

When the input voltage (a-point voltage) is in transition from the ground voltage to the power supply voltage, the a-point voltage is compared with the higher voltage threshold at the hysteresis comparator 56. When the a-point voltage exceeds the voltage threshold, the output (b-point voltage) of the hysteresis comparator 56 changes to the high level. The output (b-point voltage) from the hysteresis comparator 56 is input to the phase adjusting circuit 54, and the rise of the b-point voltage is input to the driver circuit 55 after being delayed by the delay time Tdy in the phase adjusting circuit 54. When a resultant output (d-point voltage) from the phase adjusting circuit 54 is input to the driver circuit 55, the d-point voltage is current-amplified by the driver circuit 55. The signal obtained through the current-amplification at the driver circuit 55 is input to the gate of the switching element S4 through the output terminal 93. The gate capacity of the switching element S4 is thus discharged to turn the switching element S4 off, and the collector current Ic flowing through the switching element S4 is interrupted.

The rising delay time Ton of the entire circuit including the driving circuit 32b and the switching element S4 equals Tdx+Td1+Td3, and the falling delay time Toff equals Tdy+Td2+Td4. As a result, the index Tdead indicating input/output phase characteristics is given by Tdead=Toff−Ton=Tdx+Td1+Td3−Tdy−Td2−Td4. The pulse width of the signal input to the driver circuit 55 can be made equal to the pulse width of the signal output by the switching element S4 by adjusting the delay times Tdx and Tdy in the phase adjusting circuit 54 such that an equation "Tdead=Toff−Ton=0" holds true. Since the controllability of a pulse width can be improved as thus described in exercising PWM control, the PWM control system can be provided with improved control performance.

Referring to the method of adjusting the delay times Tdx and Tdy of the b-point voltage, a plurality of constant current sources 76 as shown in FIG. 5 having different current values may be provided in the phase adjusting circuit 54, and any of the plurality of constant current sources 76 may be selected. Alternatively, the constant current source 76 shown in FIG. 5 may be incorporated through an external terminal of the driving circuit 32b.

Figure 8:
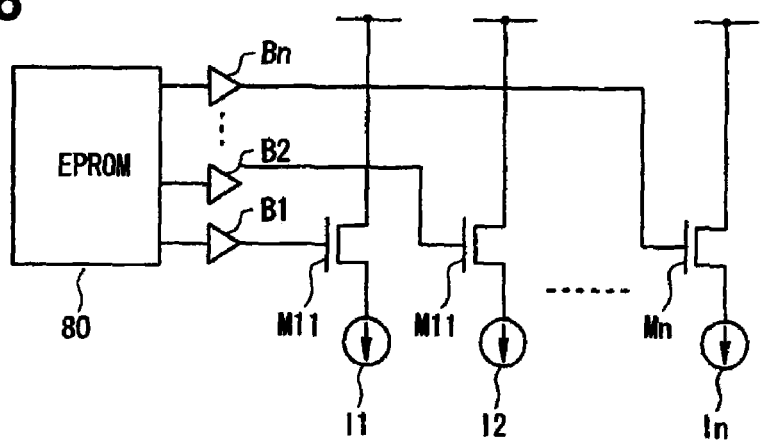
FIG. 8 is a diagram showing a method of selecting a current source in the phase delay circuit shown in FIG. 5.

FIG. 8 is a diagram showing a method of selecting a current source in the phase delay circuit shown in FIG. 5. Referring to FIG. 8, a plurality of constant current sources I1 to In having different current values are provided as the constant current source 76 shown in FIG. 5. Switching elements M1 to Mn are connected to the constant current sources I1 to In, respectively, and an EPROM 80 is connected to gates of the switching elements M1 to Mn through buffers B1 to Bn.

Data for selecting the constant current sources I1 to In so as to satisfy the equation "Tdead=Toff−Ton=0" is stored in the EPROM 80. The delay times Tdx and Tdy of the b-point voltage can be adjusted by turning on the switching elements M1 to Mn connected to the constant current sources 11 to In as specified in the EPROM 80.

An alternative method of adjusting the delay times Tdx and Tdy of the b-point voltage is to provide a plurality of reference voltage sources 78 as shown in FIG. 5 having different reference voltages in the phase adjusting circuit 54 and to select any of the plurality of reference voltages sources 78. Alternatively, the reference voltage source 78 shown in FIG. 5 may be incorporated through the external terminal of the driving circuit 32b.

Another alternative method of adjusting the delay times Tdx and Tdy of the b-point voltage is to provide a plurality of capacitors 77 as shown in FIG. 5 having different capacities in the phase adjusting circuit 54 and to select any of the plurality of capacitors 77. Alternatively, the capacitor 77 shown in FIG. 5 may be incorporated through the external terminal of the driving circuit 32b.

Referring to the method of matching the delay times Tdx and Tdy of the b-point voltage, a condenser corresponding to the switching element S4 may be added to the driving circuit 32b to set the current value of the constant current source 76, the reference voltage of the reference voltage source 78, or the capacity of the capacitor 77 such that the equation "Tdead Toff−Ton=0" holds true.

Alternatively, the switching element S4 itself may be added to the driving circuit 32b to set the current value of the constant current source 76, the reference voltage of the reference voltage source 78, or the capacity of the capacitor 77 such that the equation "Tdead=Toff−Ton=0" holds true.

Figure 9:
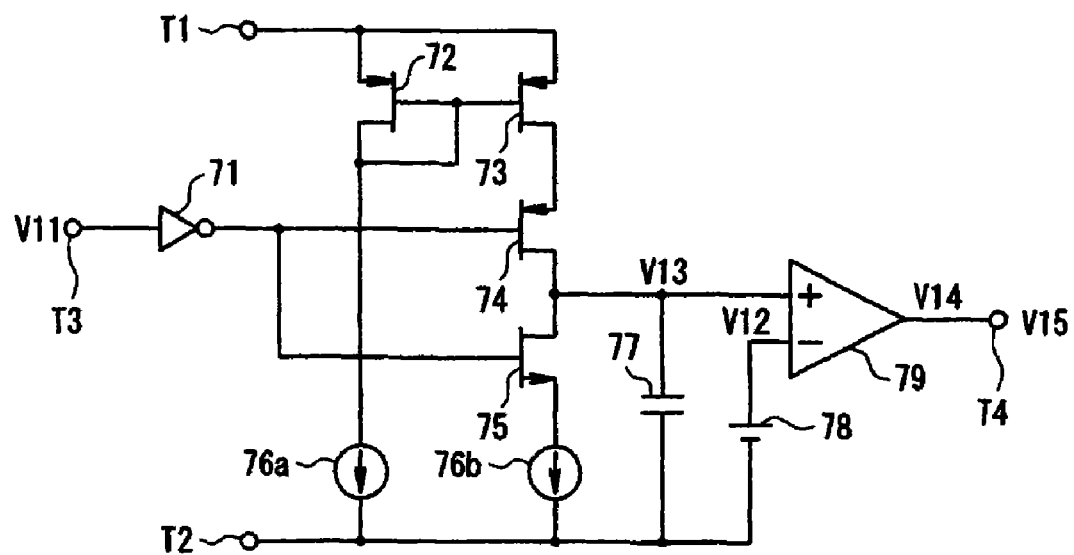
FIG. 9 is a diagram showing another example of the circuit configuration of the phase adjusting circuit shown in FIG. 2.

FIG. 9 is a diagram showing another example of the circuit configuration of the phase adjusting circuit shown in FIG. 2. Parts of the configuration identical to those in the configuration in FIG. 5 are indicated by like reference numerals, and detailed description will be omitted for such parts. Referring to FIG. 9, the drain and gate of a P-channel field effect transistor 72 of a phase delay circuit as shown in FIG. 5 are connected to a ground terminal T2 through a constant current source 76a, and the source of an N-channel field effect transistor 75 as shown in FIG. 5 is connected to the ground terminal T2 through a constant current source 76b.

Figure 10:
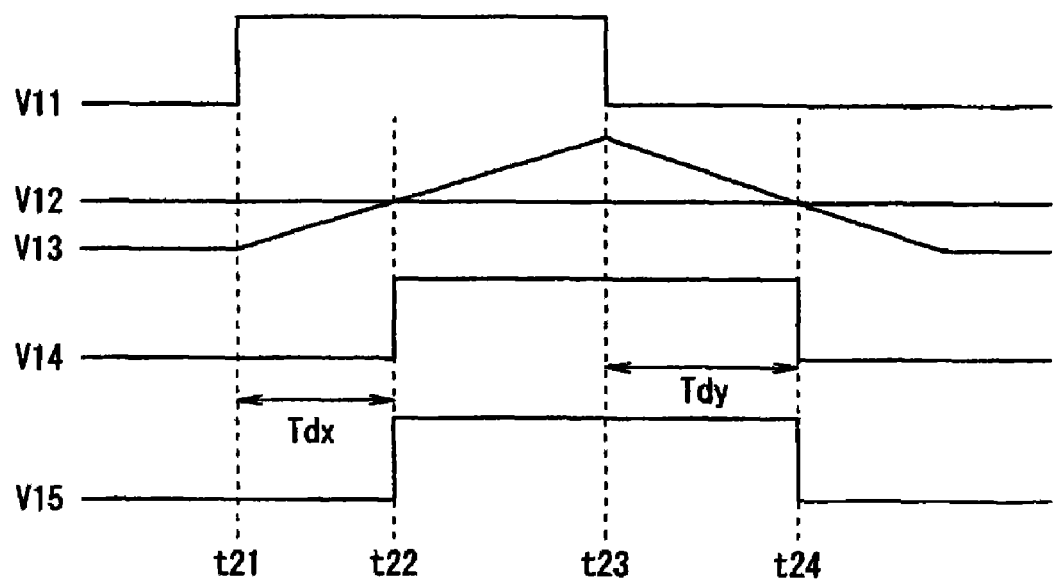
FIG. 10 is a timing chart showing operations of the phase adjusting circuit shown in FIG. 9.

FIG. 10 is a timing chart showing operations of the phase adjusting circuit shown in FIG. 9. At a time t21 shown in FIG. 10, an input voltage V11 is input to a phase delay circuit 62 as shown in FIG. 3 through an input terminal T3. When the input voltage V11 changes from the low level to the high level, the input voltage V11 is inverted by an inversion circuit 71 to change the gates of a P-channel field effect transistor 74 and an N-channel field effect transistor 75 to the low level. When the gates of the P-channel field effect transistor 74 and the N-channel field effect transistor 75 change to the low level, the P-channel field effect transistor 74 is turned on, and the N-channel field effect transistor 75 is turned off. When the P-channel field effect transistor 74 is turned on, a current having the same value as a current flowing through a P-channel field effect transistor 72 flows to a P-channel field effect transistor 73 through the constant current source 76a as a result of a current mirror operation. Thus, a capacitor 77 is charged with the current flowing through the P-channel field effect transistor 73.

A resultant voltage V13 generated at the capacitor 77 is compared with a reference voltage V12 generated by a reference voltage source 78 at a comparator 79. When the voltage V13 generated at the capacitor 77 agrees with the reference voltage V12 generated by the reference voltage source 78 at a time t22, an output voltage V14 from the comparator 79 changes from the low level to the high level, and an output voltage V15 from an output terminal T4 changes to the high level. As a result, the output voltage V15 of the output terminal T4 can be caused to rise with a delay by a delay time Tdx after the rise of the input voltage V11, and the rise of the input voltage V11 can therefore be delayed by the delay time Tdx.

When the input voltage V11 changes from the high level to the low level at a time t23, the input voltage V11 is inverted by an inversion circuit 71, and the gates of the P-channel field effect transistor 74 and the N-channel field effect transistor 75 change to the high level. When the gates of the P-channel field effect transistor 74 and the N-channel field effect transistor 75 change to the high level, the P-channel field effect transistor 74 is turned off, and the N-channel field effect transistor 75 is turned on.

When the N-channel field effect transistor 75 is turned on, the charge which has been loaded on the capacitor 77 is discharged through the N-channel field effect transistor 75 with the current flowing through the N-channel field effect transistor 75 regulated by the constant current source 76b. Thus, the voltage V13 generated at the capacitor 77 gradually decreases. When the voltage V13 generated at the capacitor 77 agrees with the reference voltage V12 generated by the reference voltage source 78 at a time t24, the output voltage V14 from the comparator 79 changes from the high level to the low level, and the output voltage V15 of the output terminal T4 changes to the low level. As a result, the output voltage V15 from the output terminal T4 can be caused to fall with a delay of a delay time Tdy after the fall of the input voltage V11, and the fall of the input voltage V11 can therefore be delayed by the delay time Tdy.

As thus described, the delay times of both rise and fall of a signal input to the driver circuit 55 can be adjusted simply by providing only either of the phase adjusting circuits 62 and 63 shown in FIG. 3. Thus, the pulse width of the signal input to the driver circuit 55 can be made equal to the pulse width of the signal output from the switching element S4.

Figure 11:
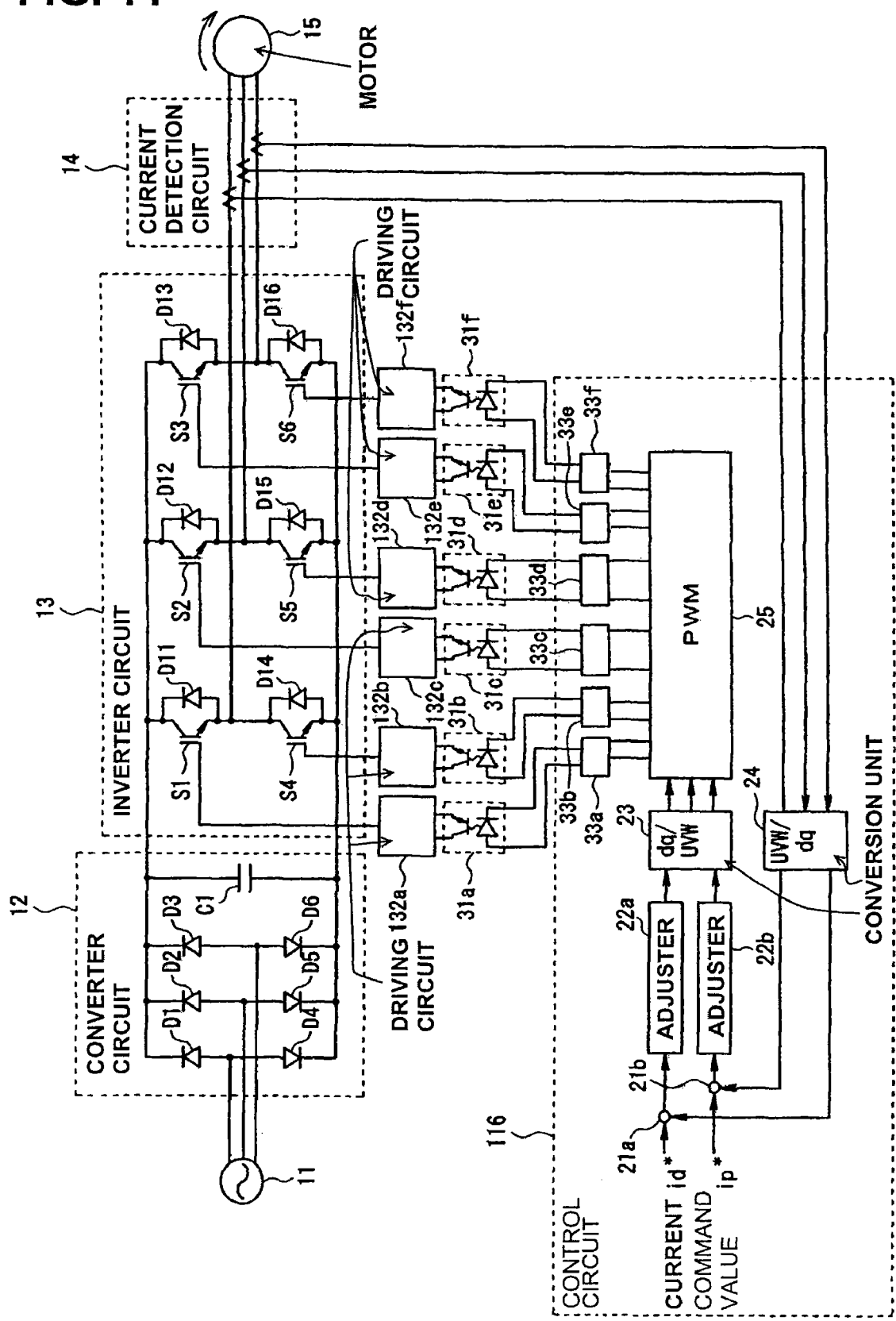
FIG. 11 is a block diagram showing a schematic configuration of a motor control system according to a second embodiment of the invention.

FIG. 11 is a block diagram showing a schematic configuration of a motor control system according to a second embodiment of the invention. Parts of the configuration identical to those in the configuration shown in FIG. 1 are indicated by like reference numerals, and detailed description will be omitted for such parts. Referring to FIG. 11, the motor control system includes a control circuit 116 for exercising feedback control of an AC motor 15, driving circuits 132a to 132f for driving an inverter 13 by outputting gate pulses to switching elements S1 to S6, respectively, and photo-couplers 31a to 31f for insulated transmission of control signals input from the control circuit 116 to the driving circuits 132a to 132f, respectively. The driving circuits 132a to 132f may be similar in configuration to the driving circuit 132 shown in FIG. 13.

The control circuit 116 includes phase adjusting circuits 33a to 33f. The phase adjusting circuits 33a to 33f can delay at least either rise or fall of gate pulses output from a PWM control unit 25 to adjust a difference between the pulse width of an input signal input to a driver circuit 55 and the pulse width of a signal output from each of switching elements S1 to S6 of an inverter circuit 13 that is driven by the driver circuit 55.

For example, the phase adjusting circuit 33b can adjust a delay time of at least either rise or fall of a signal input to the driver circuit 55 such that a delay time between a point when the input to the driver circuit 55 is started and a point when the switching element S4 is turned on equals a delay time between a point when the input to the driver circuit 55 is stopped and a point when the switching element S4 is turned off. That is, the phase adjusting circuit 33b can adjust the delay time of at least either rise or fall of the signal input to the driver circuit 55 such that an equation "Tdead=Toff−Ton=0" holds true for the entire circuit including the driving circuit 132b and the switching element S4. The phase adjusting circuits 33a to 33f may have a configuration similar to that shown in FIG. 3.

Figure 12:
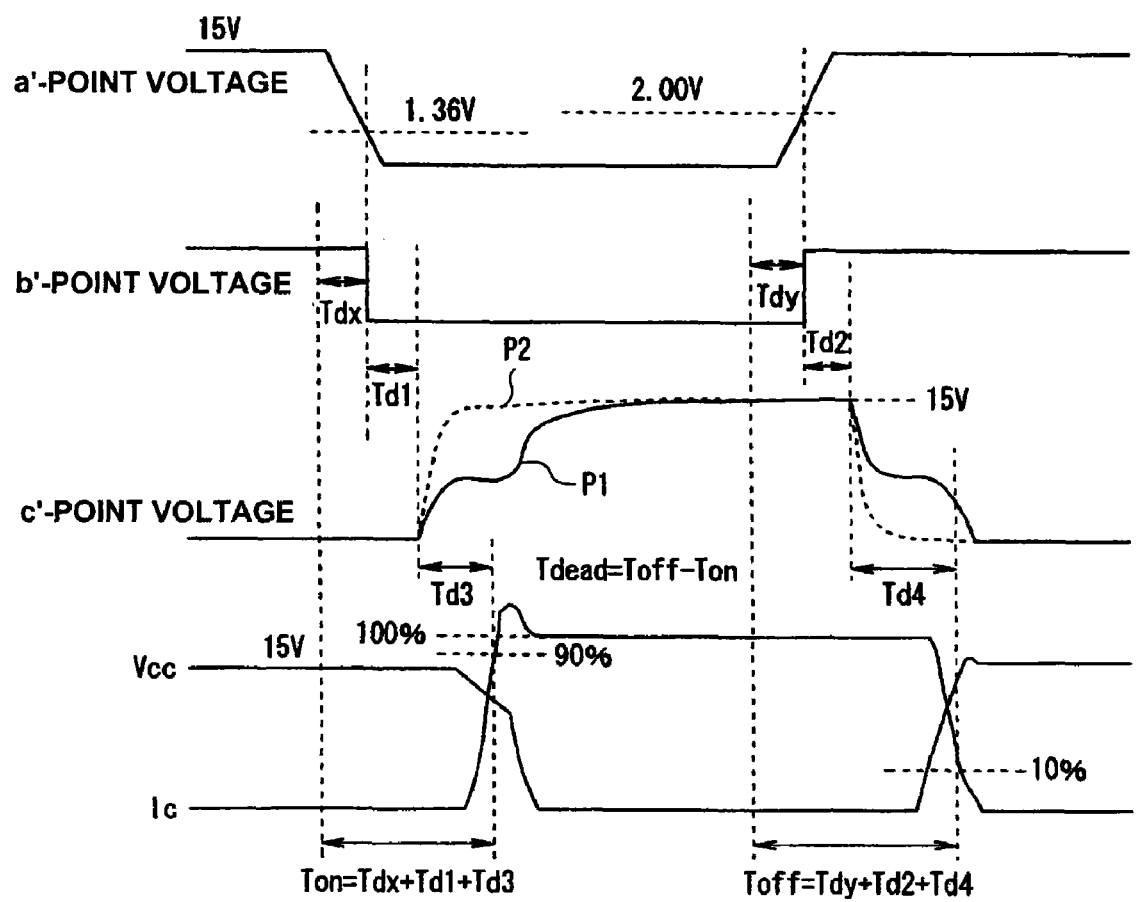
FIG. 12 is a timing chart showing operations of a control circuit and the driving circuit shown in FIG. 11.

FIG. 12 is a timing chart showing operations of the control circuit and the driving circuit shown in FIG. 11. The phase adjusting circuit 33b among the phase adjusting circuits 33a to 33f will now be described by way of example with reference to FIG. 12. A fall of a gate pulse generated by the PWM control unit 25 shown in FIG. 11 is delayed by a delay time Tdx in the phase adjusting circuit 33b and is thereafter transmitted to the driving circuit 132b through a photo-coupler 31b.

Figure 13:
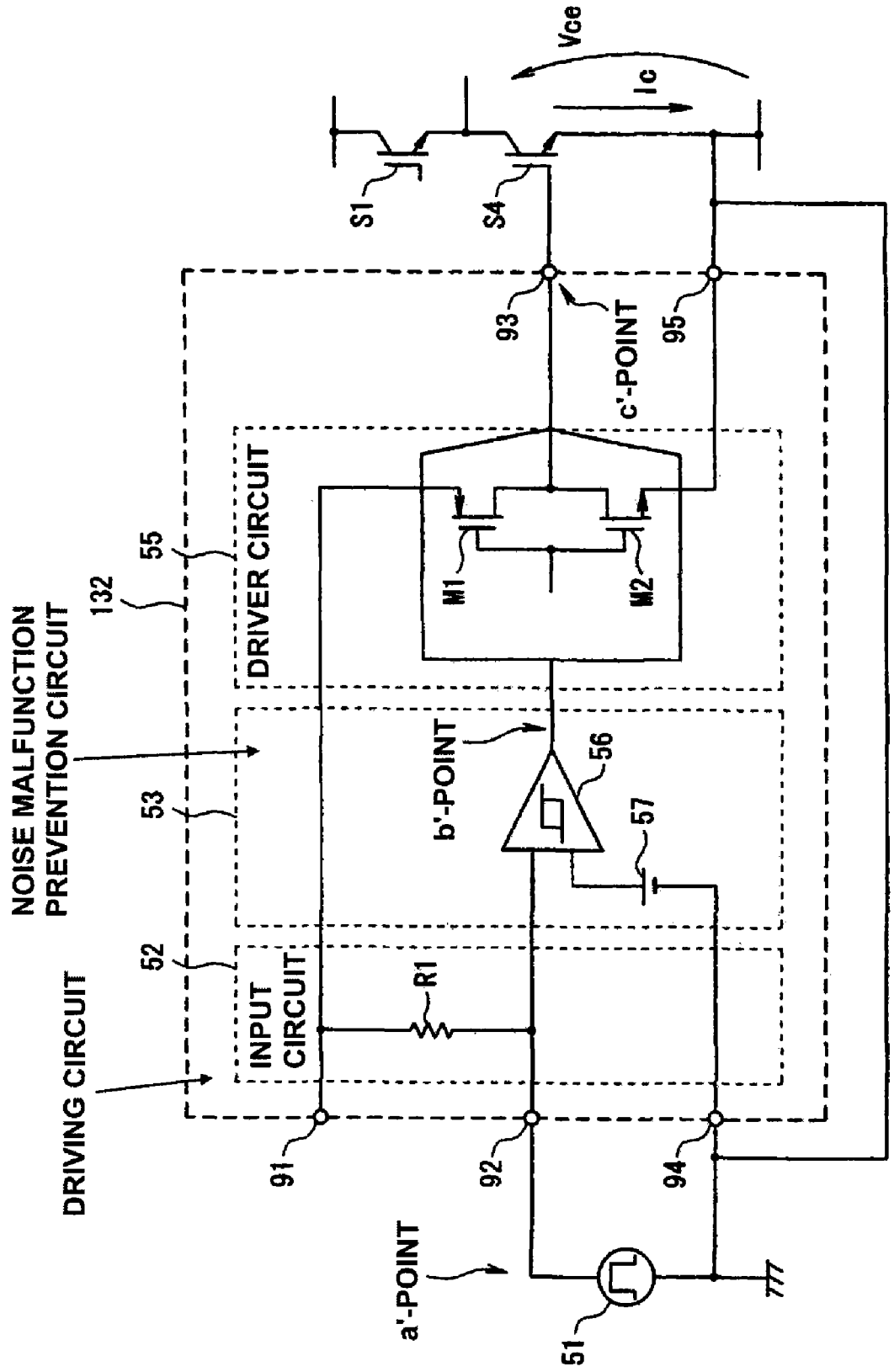
FIG. 13 is a block diagram showing a schematic configuration of a driving circuit according to the related art.
Figure 14:
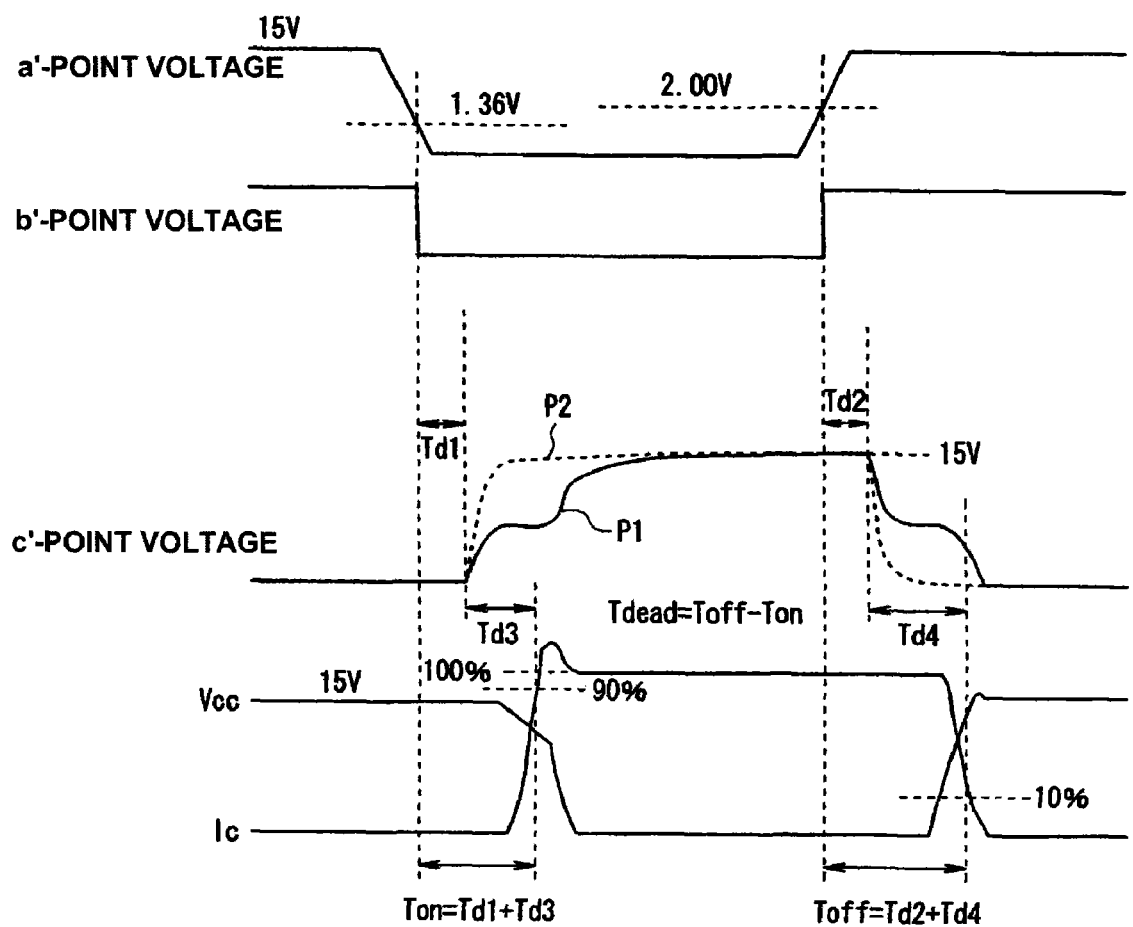
FIG. 14 is a timing chart showing operations of the driving circuit shown in FIG. 13.

When an input signal 51 as shown in FIG. 13 is input between an input terminal 92 of the driving circuit 132b and a ground terminal 94, the signal is input to a hysteresis comparator 56 through an input circuit 52. When the input signal 51 is input to the hysteresis comparator 56, the input voltage (a'-point voltage) is compared with a lower voltage threshold at the hysteresis comparator 56 in the case that the input voltage is in transition from a power supply voltage to a ground voltage. When the a'-point voltage is equal to or lower than the voltage threshold, the output (b'-point voltage) of the hysteresis comparator 56 changes to the low level.

The output (b'-point voltage) of the hysteresis comparator 56 is input to the driver circuit 55, and the b'-point voltage is current-amplified by the driver circuit 55. The signal obtained through the current amplification at the driver circuit 55 is input to the gate of the switching element S4 through an output terminal 93. Thus, the gate capacity of the switching element S4 is charged to turn the switching element S4 on and to cause a collector current Ic to flow through the switching element S4.

A rise of the gate pulse generated by the PWM control unit 25 shown in FIG. 11 is delayed by a delay time Tdy in the phase adjusting circuit 33b and is thereafter transmitted to the driving circuit 132b through the photo-coupler 31b. When the input voltage (a'-point voltage) is in a transition from the ground voltage to the power supply voltage, the a'-point voltage is compared with a higher voltage threshold in the hysteresis comparator 56. When the a'-point voltage exceeds the voltage threshold, the output (b'-point voltage) of the hysteresis comparator 56 changes to the high level.

The output (b'-point voltage) of the hysteresis comparator 56 is input to the driver circuit 55, and the b'-point voltage is current-amplified by the driver circuit 55. The signal obtained through the current amplification at the driver circuit 55 is input to the gate of the switching element S4 through the output terminal 93. Thus, the gate capacity of the switching element S4 is discharged to turn the switching element S4 off and to interrupt the collector current Ic flowing through the switching element S4.

In the entire circuit including the control circuit 116, the driving circuit 132b, and the switching element S4, a rising delay time Ton equals Tdx+Td1+Td3, and a falling delay time Toff equals Tdy+Td2+Td4. As a result, an index Tdead indicating input/output phase characteristics is given by Tdead=Toff−Ton=Tdx+Td1+Td3−Tdy−Td2−Td4.

The pulse width of the signal input to the driver circuit 55 can be made equal to the pulse width of the signal output by the switching element S4 by adjusting the delay times Tdx and Tdy in the phase adjusting circuit 33b such that an equation "Tdead=Toff−Ton=0" holds true. Since the controllability of a pulse width can be improved as thus described in exercising PWM control, the PWM control system can be provided with improved control performance.

Referring to the method of adjusting the delay times Tdx and Tdy of the b'-point voltage, a plurality of constant current sources 76 as shown in FIG. 5 having different current values may be provided in the phase adjusting circuit 33b, and any of the plurality of constant current sources 76 may be selected.

Alternatively, the constant current source 76 shown in FIG. 5 may be incorporated through an external terminal of the control circuit 116.

An alternative method of adjusting the delay times Tdx and Tdy of the b'-point voltage is to provide a plurality of reference voltage sources 78 as shown in FIG. 5 having different reference voltages in the phase adjusting circuit 33b and to select any of the plurality of reference voltages sources 78. Alternatively, the reference voltage source 78 shown in FIG. 5 may be incorporated through the external terminal of the control circuit 116.

Another alternative method of adjusting the delay times Tdx and Tdy of the b'-point voltage is to provide a plurality of capacitors 77 as shown in FIG. 5 having different capacities in the phase adjusting circuit 33b and to select any of the plurality of capacitors 77. Alternatively, the capacitor 77 shown in FIG. 5 may be incorporated through the external terminal of the control circuit 116.

The invention has been described with reference to certain preferred embodiments thereof. It will be understood, however, that variations and modifications are possible within the scope of the appended claims.

What is claimed is:

1. An inverter driving circuit comprising:
   an input circuit for inputting an input signal in the form of a rectangular wave;
   a driver circuit for driving an inverter based on the input signal input through the input circuit; and
   a phase adjusting circuit which is provided upstream of the driver circuit and which delays at least either a rise or a fall of the input signal to adjust any difference between a pulse width of the input signal input to the driver circuit and a pulse width of a signal output from a switching element of the inverter driven by the driver circuit;
   wherein the phase adjusting circuit adjusts the delay time of at least either the rise or the fall of the input signal such that a delay time between a point when the input of the input signal to the driver circuit is started and a point when the switching element is turned on equals a delay time between a point when the input of the input signal to the driver circuit is stopped and a point when the switching element is turned off.

2. The inverter driving circuit according to claim 1, wherein the phase adjusting circuit includes:
   a constant current source for generating a constant current;
   a capacitor for charging the current generated by the constant current source;
   a reference voltage source for generating a reference voltage;
   a switching element for supplying the current generated by the constant current source to the capacitor based on the input signal; and
   a comparator for comparing the reference voltage generated by the reference voltage source and a voltage generated by the capacitor and wherein the delay time of at least either rise or fall of the input signal is set based on the result of the comparison made by the comparator.

3. The inverter driving circuit according to claim 2, wherein at least one of the constant current source, the capacitor, and the reference voltage source includes a plurality of such elements having different current values, capacities or reference voltages and wherein any of the constant current sources, capacitors or reference voltage sources is selected from the plurality of constant current sources, capacitors or reference voltage sources to adjust at least either the rise or the fall of the input signal.

4. The inverter driving circuit according to claim 2, wherein at least one of the constant current source, the capacitor, and the reference voltage source is incorporated through an external terminal of the driving circuit.

5. An inverter control circuit, comprising:
   a PWM control unit for exercising PWM control over an inverter; and
   a phase adjusting circuit which is provided upstream of a driving circuit for driving the inverter and which delays at least either a rise or a fall of a control signal output from the PWM control unit to adjust a difference between a pulse width of an input signal input to the driving circuit and a pulse width of a signal output from a switching element of the inverter controlled by the driving circuit
   wherein the phase adjusting circuit adjusts the delay time of at least either the rise or the fall of the control signal such that a delay time between a point when the input of the input signal to the driver circuit is started and a point when the switching element is turned on equals a delay time between a point when the input of the input signal to the driver circuit is stopped and a point when the switching element is turned off.

6. The inverter control circuit according to claim 5, wherein the phase adjusting circuit includes:
   a constant current source for generating a constant current,
   a capacitor for charging the current generated by the constant current source,
   a reference voltage source for generating a reference voltage,
   a switching element for supplying the current generated by the constant current source to the capacitor based on the input signal, and
   a comparator for comparing the reference voltage generated by the reference voltage source and a voltage generated by the capacitor and wherein the a delay time of at least either rise or fall of the control signal is set based on the result of the comparison made by the comparator.

7. The inverter control circuit according to claim 6, wherein at least one of the constant current source, the capacitor, and the reference voltage source is constituted by a plurality of such elements having different current values, capacities or reference voltages and wherein any of the constant current sources, capacitors or reference voltage sources is selected from the plurality of constant current sources, capacitors or reference voltage sources to adjust at least either rise or fall of the control signal.

8. The inverter control circuit according to claim 6, wherein at least one of the constant current source, the capacitor, and the reference voltage source is incorporated through an external terminal of the control circuit.

* * * * *